US008465657B2

(12) United States Patent
Chanda et al.

(10) Patent No.: US 8,465,657 B2
(45) Date of Patent: *Jun. 18, 2013

(54) POST CHEMICAL MECHANICAL POLISHING ETCH FOR IMPROVED TIME DEPENDENT DIELECTRIC BREAKDOWN RELIABILITY

(75) Inventors: Kaushik Chanda, Fishkill, NY (US); James J. Demarest, Fishkill, NY (US); Ronald G. Filippi, Wappinger Falls, NY (US); Roy C. Iggulden, Stoughton, MA (US); Edward W. Kiewara, Verbank, NY (US); Ping-Chuan Wang, Hopewell Junction, NY (US); Yun-Yu Wang, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 1191 days.

This patent is subject to a terminal disclaimer.

(21) Appl. No.: 11/833,283

(22) Filed: Aug. 3, 2007

(65) Prior Publication Data
US 2007/0267386 A1 Nov. 22, 2007

Related U.S. Application Data

(63) Continuation of application No. 10/908,392, filed on May 10, 2005, now Pat. No. 7,287,325.

(51) Int. Cl.
*H01B 13/00* (2006.01)
*B44C 1/22* (2006.01)
(52) U.S. Cl.
USPC .................................. 216/18; 216/83; 216/89

(58) Field of Classification Search
USPC .................... 438/626, 637, 618, 622; 216/18, 216/13, 40, 89, 83
See application file for complete search history.

(56) References Cited

U.S. PATENT DOCUMENTS
5,789,315 A 8/1998 Besser et al.
5,821,603 A * 10/1998 Puntambekar ................ 257/640
(Continued)

FOREIGN PATENT DOCUMENTS
EP 1 249 866 A2 10/2002
JP 11-238797 8/1999

OTHER PUBLICATIONS
Noguchi, et al., "Cu-Ion-Migration Phenomena and Its Influence on TDDB Lifetime in Cu Metallization", IEEE, 2003, pp. 287-292.

*Primary Examiner* — Nadine Norton
*Assistant Examiner* — Mahmoud Dahimene
(74) *Attorney, Agent, or Firm* — Gibb & Riley, LLC

(57) ABSTRACT

Disclosed are a damascene and dual damascene processes both of which incorporate the use of a release layer to remove trace amounts of residual material between metal interconnect lines. The release layer is deposited onto a dielectric layer. The release layer comprises an organic material, a dielectric material, a metal or a metal nitride. Trenches are etched into the dielectric layer. The trenches are lined with a liner and filled with a conductor. The conductor and liner materials are polished off the release layer. However, trace amounts of the residual material may remain. The release layer is removed (e.g., by an appropriate solvent or wet etching process) to remove the residual material. If the trench is formed such that the release layer overlaps the walls of the trench, then when the release layer is removed another dielectric layer can be deposited that reinforces the corners around the top of the metal interconnect line.

21 Claims, 15 Drawing Sheets

U.S. PATENT DOCUMENTS

| | | | |
|---|---|---|---|
| 6,004,188 A | 12/1999 | Roy | |
| 6,017,817 A | 1/2000 | Chung et al. | |
| 6,093,600 A | 7/2000 | Chen et al. | |
| 6,107,159 A | 8/2000 | Chuang | |
| 6,245,666 B1 | 6/2001 | Ko et al. | |
| 6,252,292 B1 | 6/2001 | Brintzinger et al. | |
| 6,312,985 B1 | 11/2001 | Wu et al. | |
| 6,316,352 B1 | 11/2001 | Wu et al. | |
| 6,380,078 B1 | 4/2002 | Liu et al. | |
| 6,420,258 B1 | 7/2002 | Chen et al. | |
| 6,440,840 B1 | 8/2002 | Chen | |
| 6,440,861 B1 | 8/2002 | Liu et al. | |
| 6,455,372 B1 | 9/2002 | Weimer | |
| 6,559,007 B1 | 5/2003 | Weimer | |
| 6,559,543 B1 | 5/2003 | Dunham et al. | |
| 6,613,664 B2 | 9/2003 | Barth et al. | |
| 6,667,533 B2 | 12/2003 | Daubenspeck et al. | |
| 6,699,396 B1 * | 3/2004 | Drewery | 216/40 |
| 6,828,299 B2 | 12/2004 | Yang et al. | |
| 6,869,871 B1 * | 3/2005 | Choi | 438/622 |
| 2004/0198062 A1 | 10/2004 | Ye et al. | |
| 2008/0286978 A1 * | 11/2008 | Chen et al. | 438/713 |

* cited by examiner

POST CHEMICAL MECHANICAL POLISHING ETCH FOR IMPROVED TIME DEPENDENT DIELECTRIC BREAKDOWN RELIABILITY

CROSS-REFERENCE TO RELATED APPLICATIONS

This application is a continuation of U.S. Pat. No. 7,287,325, Issued Oct. 30, 2007, now U.S. Pat. No. 7,287,325, the complete disclosure of which, in its entirety, is herein incorporated by reference.

BACKGROUND OF THE INVENTION

1. Field of the Invention

The invention relates generally to a damascene method of fabricating metal interconnections on integrated circuits and, more particularly, to a damascene method that incorporates the use of a release layer to remove residual liner and metal particles that can cause electrical shorts between the metal interconnections.

2. Description of the Related Art

The damascene process is a process in which metal interconnect lines are delineated and isolated in dielectrics by means of chemical mechanical polishing (CMP). A dual damascene process is a similar process in which both metal interconnect lines and vias (i.e., conductor-filled channels) are delineated, such that the conductor material used to form the metal interconnect lines is continuous with the conductor of the vias. Time Dependent Dielectric Breakdown (TDDB) is a technique commonly used to test the reliability of dielectrics in metal oxide semiconductor (MOS) device technologies, e.g., to test the reliability of the dielectric material used to isolate metal interconnect lines. Often times TDDB fails occur in the metal interconnections. For example, short circuits may be caused by residual metal (e.g., copper (Cu)) or liner materials (e.g., titanium (Ti), titanium nitride (TiN), tantalum (Ta), tantalum nitride (TaN), tungsten (W), etc.) that is not removed from the dielectric material by the CMP during the damascene or dual damascene process. One known solution to removing the residual liner and/or metal material is further polishing of the dielectric material and the metal interconnect lines. However, increased polishing can remove too much of the metal and, thus, can cause an increase in resistance. Therefore, an improved damascene and dual damascene process is needed to improve device reliability without forfeiting line resistance.

SUMMARY OF THE INVENTION

This disclosure presents a damascene method of fabricating a metal interconnect line of a semiconductor device and a dual damascene method of fabricating a metal interconnect line and a via of a semiconductor device. In an embodiment of the damascene method a sacrificial release layer is formed on a dielectric layer. A trench is etched through the release layer and into the dielectric layer. The trench is lined with a liner and filled with a conductor. The liner and the conductor are polished off of the release layer to form a conductive interconnect line. However, trace amounts of the liner and/or the conductor may remain on the release layer after the polishing process. The release layer is then removed in order to remove the trace amounts of liner and conductor. The process of etching the trench can comprise performing an isotropic etching process such that the release layer overlaps the sidewalls of the trench. Etching in this manner allows the top corners of the conductive interconnect line to be reinforced later in the process by a second dielectric layer. After polishing the liner and the conductor, the conductive interconnect line may be recessed level with the dielectric layer. Also, after removing the release layer, a capping layer can be deposited over the dielectric layer and the conductive interconnect line. Alternatively, after the release layer is removed a second dielectric layer can be deposited over the dielectric layer and the conductive interconnect line. If this trench was etched such that the release layer overlapped the sidewalls, then a narrow top portion of the interconnect line is formed and extends above the dielectric layer. Removing the release layer and depositing the second dielectric layer, reinforces the corners of the top portion and thereby makes the device more reliable. This second dielectric layer can be polished to expose the conductive interconnect line. Then, a capping layer can be deposited over the second dielectric layer and the conductive interconnect line. The release layer may be formed by depositing an organic material over the dielectric layer and this organic material can be removed by dissolving it in an organic solvent. Alternatively, the release layer may be formed by depositing a dielectric material, a metal or a metal nitride. A dielectric material, a metal or a metal nitride may be removed by performing a wet etching process. The release layer removal process can be selective for the release layer to prevent etch back of other layers. Alternatively, the release layer removal process does not have to be selective for the release layer as long as after the release layer is removed, the dielectric layer and the conductive interconnect line are polished level with each other in order to create a planar surface and to adjust for any etch back.

In an embodiment of the dual damascene method a sacrificial release layer is formed on a dielectric layer. Then, a multi-level trench structure, comprising a deep first tier and a shallow second tier, is etched into the dielectric layer. The multi-layer trench structure is lined with a liner and filled with a conductor. The liner and the conductor are polished off of the release layer, thereby, forming a conductor filled via in the first tier and a conductive interconnect line in the second tier. However, trace amounts of the liner and/or the conductor may remain on the release layer after polishing. The release layer is removed in order to remove the trace amounts of the liner and conductor. The process of etching the second tier can comprise performing an isotropic wet etching process such that the release layer overlaps the sidewalls of the second tier. Etching in this manner allows the corners of the top portion of the conductive interconnect line to be reinforced later in the process. After polishing off the liner and the conductor, the conductive interconnect line may be recessed level with the dielectric layer. Then, after removing the release layer, a capping layer can be deposited over the dielectric layer and the conductive interconnect line. Alternatively, after the release layer is removed, a second dielectric layer can be deposited over the dielectric layer and the conductive interconnect line. If the second tier was etched such that the release layer overlapped the sidewalls, then a narrow top portion of the conductive interconnect line is formed and extends above the dielectric layer. Removing the release layer and depositing the second dielectric layer, reinforces the corners of the top portion and thereby makes the device more reliable. The second dielectric layer can be polished to expose the conductive interconnect line. Then, a capping layer can be deposited over the second dielectric layer and the conductive interconnect line. The release layer may be formed by depositing an organic material over the dielectric layer and this organic material can be removed by dissolving it in an organic solvent. Alternatively, the release layer may be formed by depositing a dielectric material, a metal or a metal nitride. A dielectric material, a metal or a metal nitride may be removed by performing a wet etching process. The release layer removal process can be selective for the release layer in order to prevent etch back of other layers. Alternatively, the release layer removal process does not have to be selective for the release layer as long as after the release layer is removed, the dielectric layer and the conductive interconnect line are polished level with each other in order to create a planar surface and to adjust for any etch back.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF THE INVENTION

Figure 1:
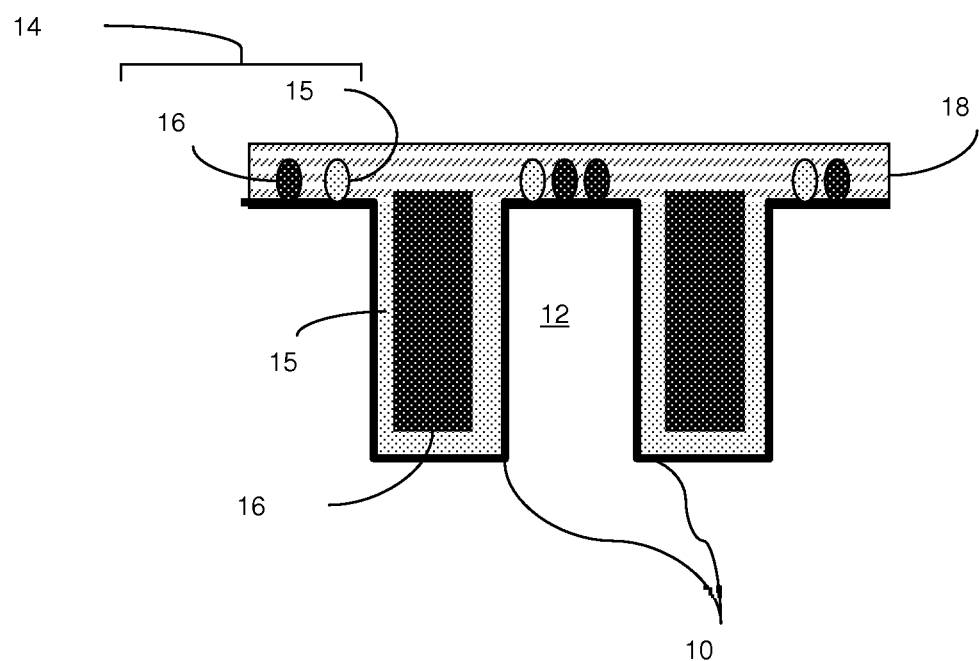
FIG. 1 is a schematic illustration of a cross-section of a metal interconnect structure fabricated according to prior art methods.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As discussed above, Time Dependent Dielectric Breakdown (TDDB) is a technique commonly used to test the reliability of the dielectric material used to isolate metal interconnect lines. Referring to FIG. 1, often times TDDB fails occur due to short circuits between the metal interconnections 10 caused by trace amounts of residual material 14 on the dielectric layer 12 between the lines 10. During a damascene or dual damascene process, a line 10 is generally formed with a liner 15 and a conductor 16. The residual material 14 may comprise residual conductor 16 (e.g., copper (Cu)) or liner 15 materials (e.g., titanium (Ti), titanium nitride (TiN), tantalum (Ta), tantalum nitride (TaN), tungsten (W), etc.) that are not removed from the dielectric material 12 by polishing (e.g., CMP) during the damascene or dual damascene process. The residual material 14 remains on the dielectric layer 12, when the nitride capping layer 18 is applied. The presence of residual material 14, such as Ta, between the M1 metal lines 10 may also be due to a discharging effect of a large field in the dielectric 12.

One solution to removing the residual material 14 is further polishing of the dielectric layer 12 and the metal interconnect lines 10. However, increased polishing can remove too much of the metal interconnect lines 10 and, thus, can cause an increase in resistance. The damascene method disclosed in U.S. Pat. No. 6,699,396 issued to Drewery on Mar. 2, 2004 and incorporated herein by reference is designed to eliminate such defects. Specifically, the Drewery '396 patent discloses forming a release layer on the dielectric layer of a wafer. Large trenches (e.g., for lines having a 3-20 micron width and a 3-20 micron height) are etched and the metal lines are formed within the trench. The lines may be formed by depositing a barrier layer and a seed layer over the release layer and into the trench. Copper electroplating covers the wafer and fills the trench. The release layer is then dissolved, without polishing, in an attempt to remove the above layers. Optionally, polishing may be conducted after removing the release layer to level the surface of the resulting structure. However, removing the release layer without prior polishing, does not thoroughly remove residual conductive particles from the surface of the dielectric. Therefore, improved damascene and dual damascene processes are needed to improve device reliability without forfeiting line resistance. Disclosed herein are improved damascene or dual damascene processes that incorporate the use of a sacrificial release layer to remove trace amounts of residual material (e.g, liner and conductor) that remain on the dielectric layer after the liner and conductor are polished (e.g., by CMP) off the dielectric layer.

Figure 2:
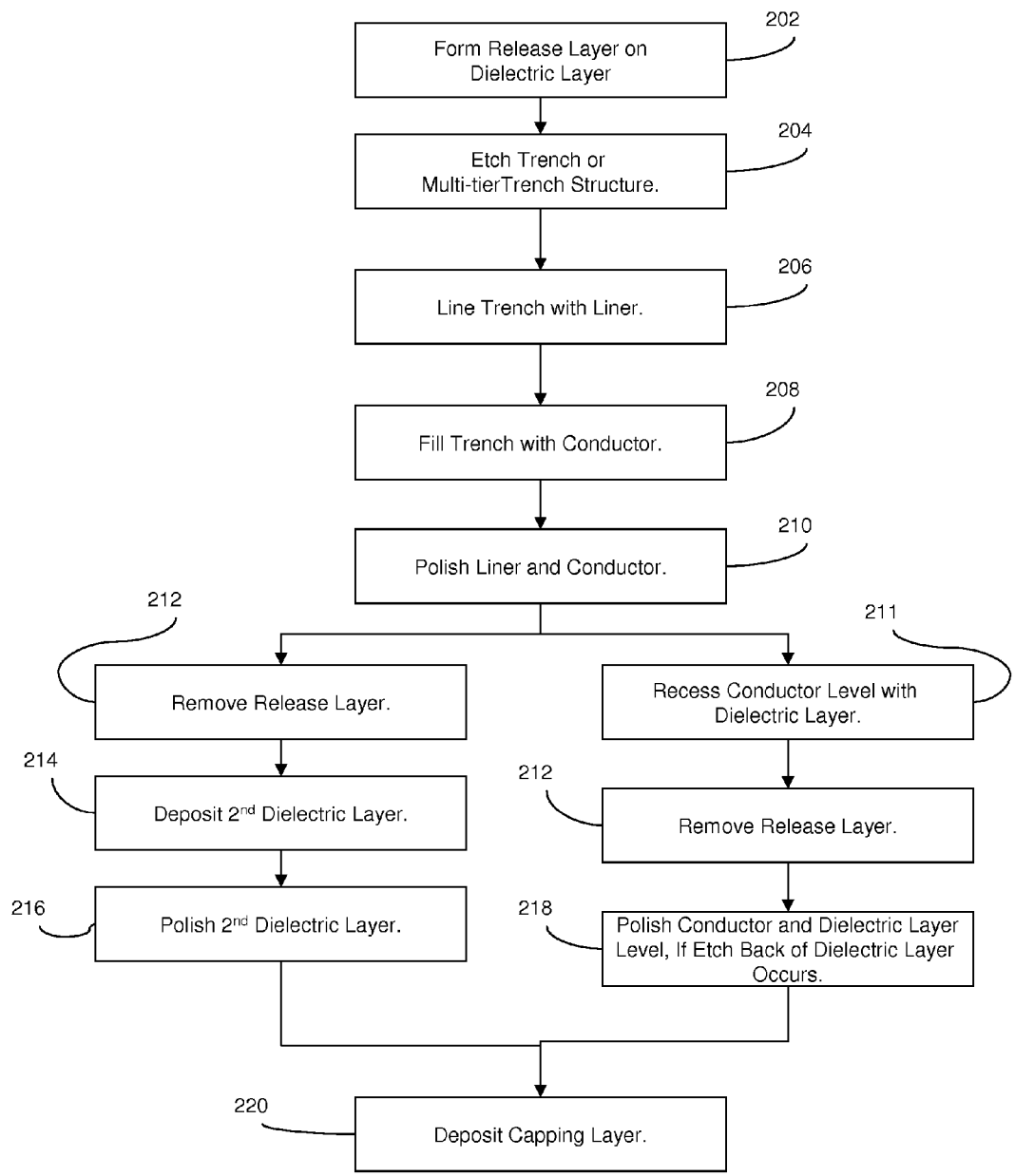
FIG. 2 is a schematic flow diagram of the method of the present invention.
Figure 3:
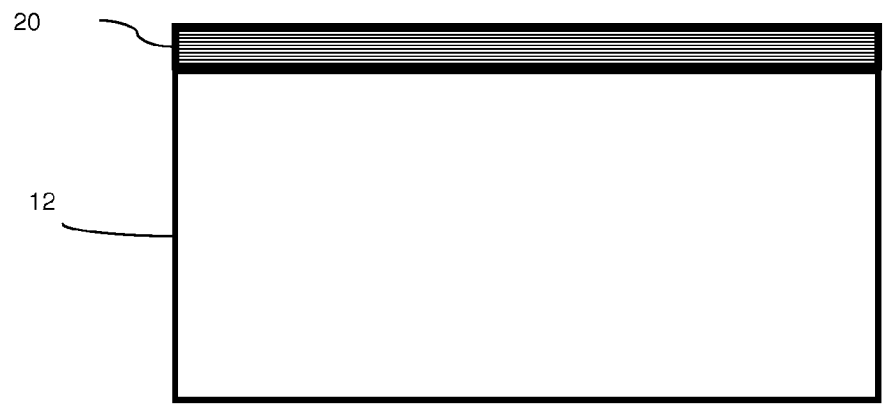
FIGS. 3 through 10 are schematic illustrations of cross-sections of partially completed metal interconnect structures fabricated according to the method of the present invention.

Referring to the schematic flow diagram of FIG. 2, in an embodiment of the method of the present invention, a damascene process comprises a sacrificial release layer 20 being formed on a dielectric layer 12, e.g., a silicon oxide layer of a wafer (202; see FIG. 3). The release layer 20 can be formed by depositing one or more of a variety of different materials, such as an organic material, a dielectric material, a metal or a metal oxide, onto the dielectric layer 12. For example, the release layer 20 can comprise a spin-on organic film, including but not limited to, a photoresist, a polyimide, and an organic spin-on planarizing agent. The release layer 20 can comprise a dielectric material, including but not limited to a silicon oxide, a silicon nitride, a silicon oxynitride, and an aluminum oxide. The release layer 20 can also comprise a metal or a metal nitride such as silicon, tungsten, aluminum, titanium nitride and gallium nitride.

Figure 4:
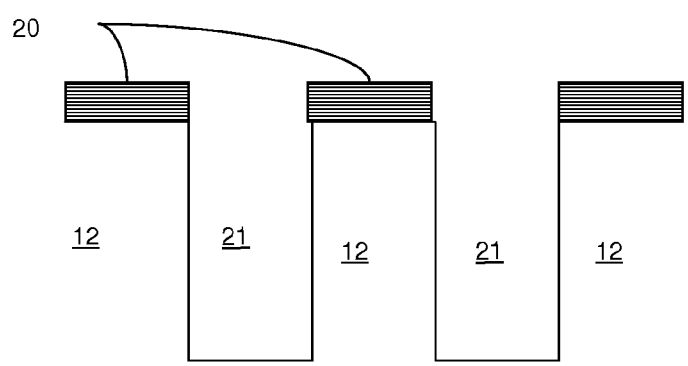
Figure 5:
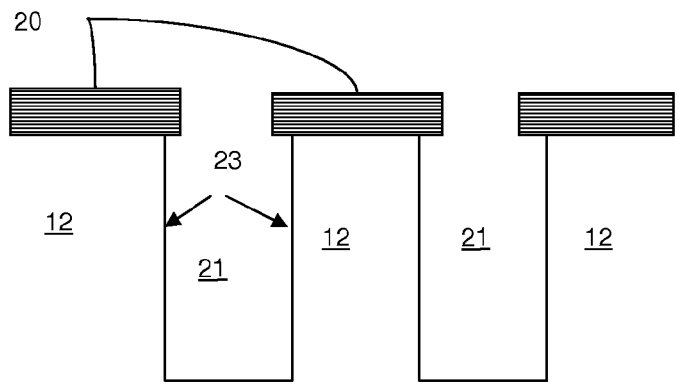
Figure 6:
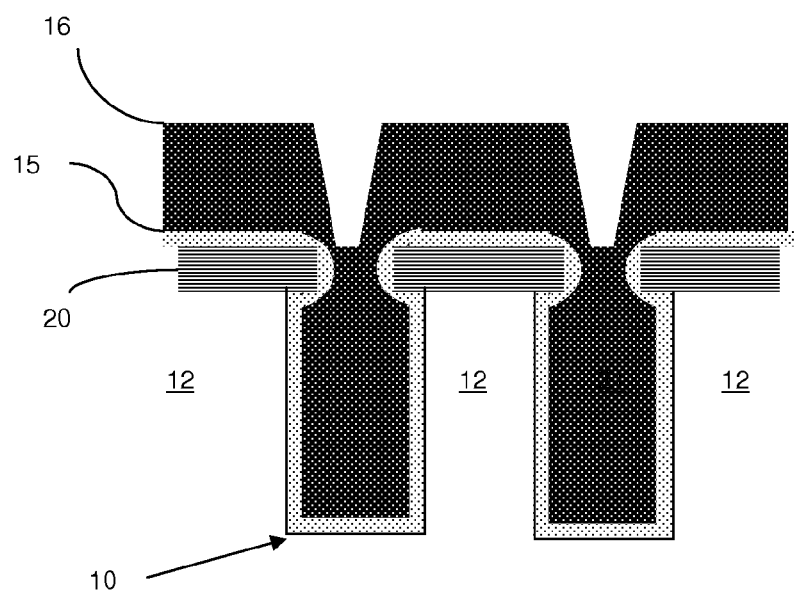

A trench 21 is etched through the release layer 20 and into the dielectric layer 12 (204; see FIG. 4). The process (204) of etching the trench 21 can comprise performing an isotropic etching process (e.g., an isotropic wet etching process) such that the release layer 20 overlaps the sidewalls 23 of the trench 21 (see FIG. 5). FIG. 5 is offered for illustrative purposes only. Those skilled in the art will recognize that an isotropic etch will necessarily produce tapered trench 21 sidewalls 23. Allowing the release layer 20 to overlap the sidewalls 23 at this stage in the process provides a means for improving the reliability of the upper corners of the conductive interconnect lines 10 later in the process (see discussion referencing FIGS. 12-15 below). The trench 21 is lined with a liner 15 (206) and filled with a conductor 16 (208) (see FIG. 6). Exemplary liner 15 materials are titanium (Ti), titanium nitride (TiN), tantalum (Ta), tantalum nidride (TaN) and tungsten (W). Copper (Cu) is an exemplary conductor 16 material.

Figure 7:
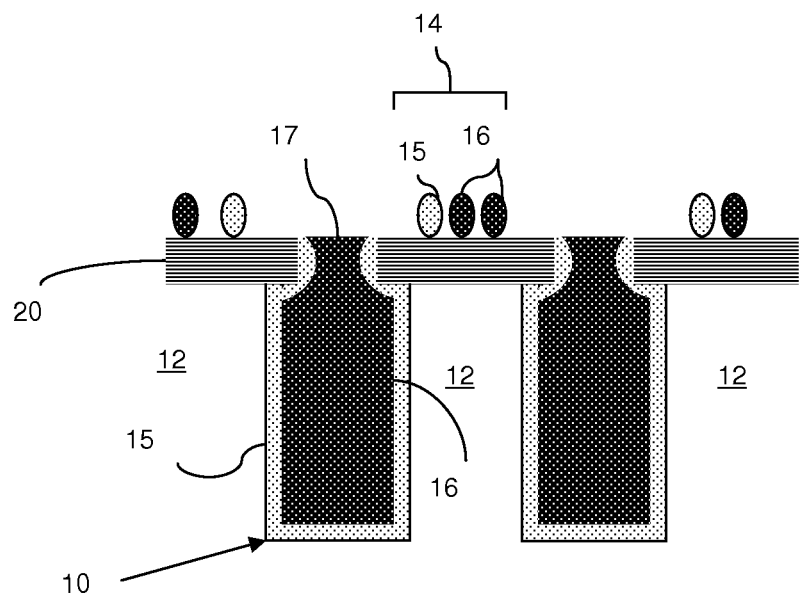

The liner 15 and the conductor 16 are polished (e.g., by CMP) off of the release layer 20 (e.g., by CMP), thereby, creating a conductive interconnect line 10 (210). However, trace amounts 14 of the liner 15 and/or the conductor 16 may remain on the release layer 20 after the polishing process (see FIG. 7). The polishing process 210 should be performed such that only a minimal amount of the release layer 20 is removed.

Figure 8:
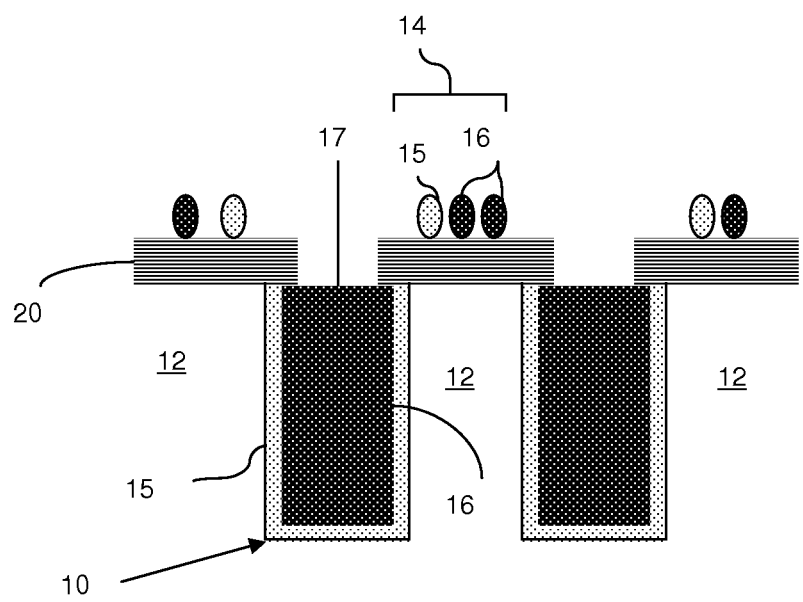
Figure 9:
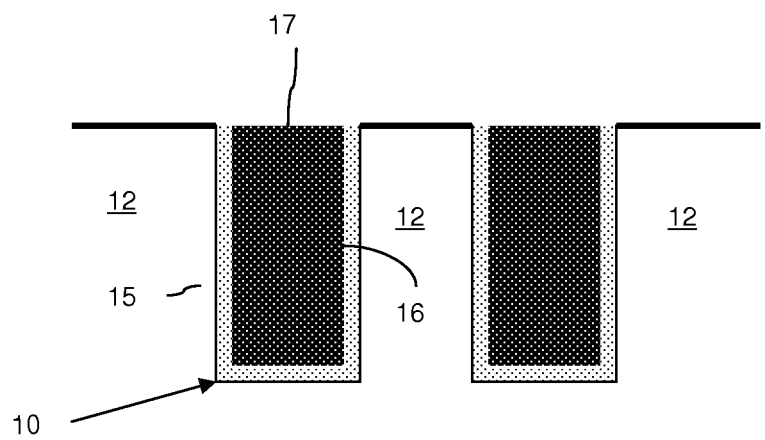
Figure 10:
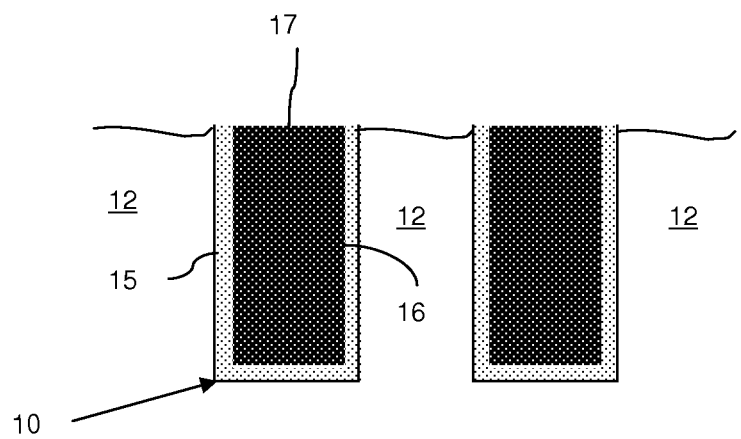
Figure 11:
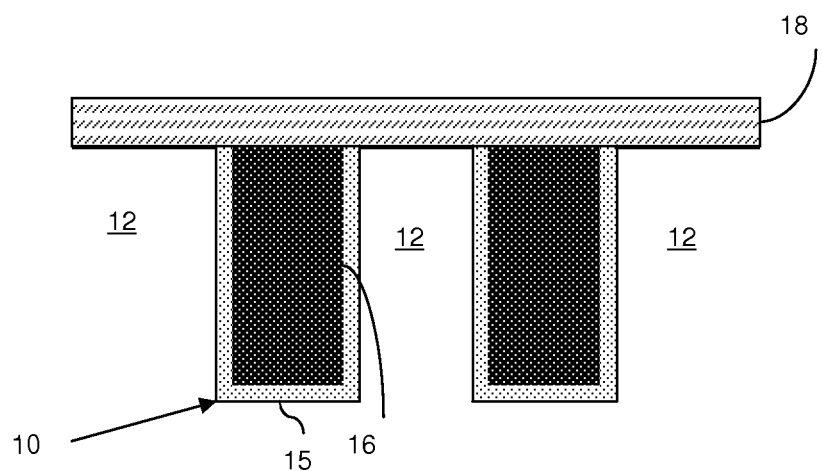
FIG. 11 is a schematic illustration of a cross-section of a completed metal interconnect structure fabricated according to the method of the present invention.

After the polishing process 210, the top 17 of the conductive interconnect line 10, may be recessed (e.g., by selective etching) level with the dielectric layer 12 (211; see FIG. 8). The release layer 20 can then be removed (212; see FIGS. 9-10). The process (212) of removing the release layer 20 is dependent upon the type of material used in depositing the release layer 20. If an organic material is used to form the release layer 20, then an organic solvent may be used to dissolve the release layer 20 (e.g., acetone, ethanol, trichloroethylene, isoporpanol, n-methyl pyrrolidone, etc.). If a dielectric material, a metal or a metal nitride is used to form the release layer 20, then a wet etching process may be used to remove release layer 20. For example, buffered or diluted hydrofluoric acid and water based etchants may be used to remove silicon oxides. Hot phosphoric acid based etchants may be used to remove silicon nitrides and aluminum. Hydroflouric acid and ethylene glycol based etchants may be used to remove silicon oxynitrides. Potassium hydroxide based etchants may be used to remove silicon. Potassium ferricyanide based etchants may be used to remove tungsten. A proprietary etch, such as Transetch®-N, may be used to remove aluminum oxides and gallium nitride. Hydrogen peroxide based etchants may be used to remove titanium nitride. The release layer 20 removal process (212) can be selective for the release layer 20 over the dielectric layer 12, the liner 15 and the conductor 16, in order to prevent etch back (e.g., etch back of the dielectric layer 12, see FIG. 9). However, the removal process (212) does not have to be selective for the release layer 20 over the dielectric layer 12, the liner 15 or the conductor 16 (see FIG. 10) as long as after the release layer 20 is removed at process (212), the dielectric layer 12 and the conductive interconnect line 10 are polished level (e.g., CMP) with each other in order to create a planar surface and to adjust for any etch back (218). After removing the release layer 20, a capping layer 18 (e.g., a nitride layer) can be deposited over the dielectric layer 12 and the conductor 16 to complete the structure (220; see FIG. 11).

Figure 12:
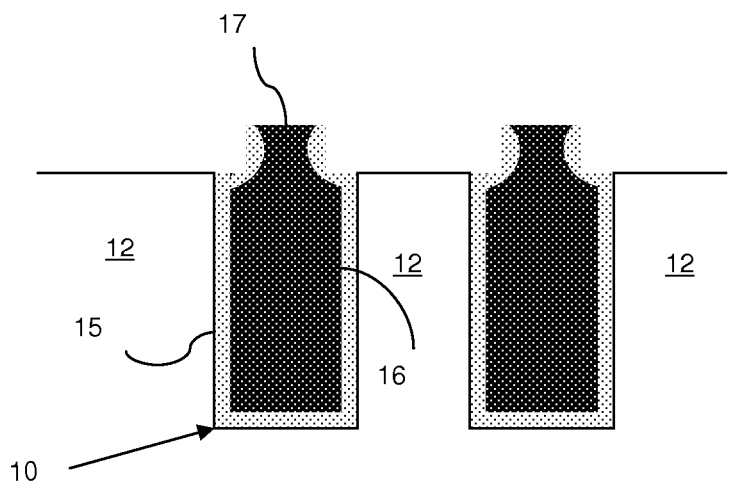
FIGS. 12 through 14 are schematic illustrations of cross-sections of partially completed metal interconnect structures fabricated according to the method of the present invention.
Figure 13:
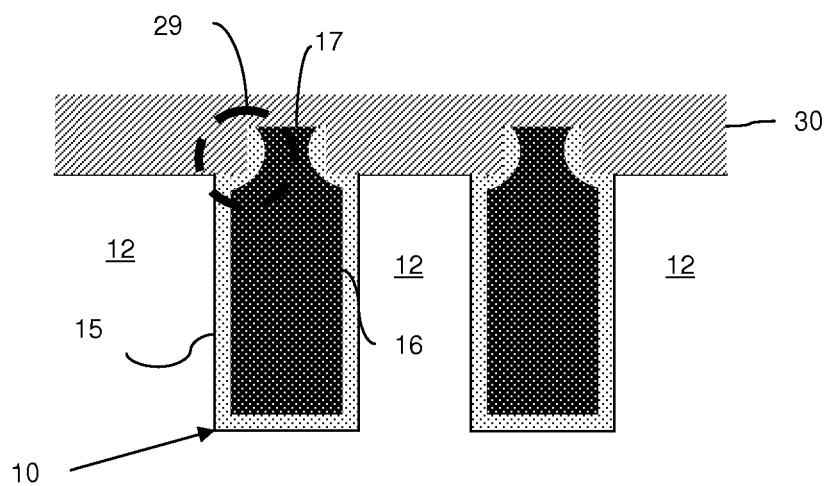
Figure 14:
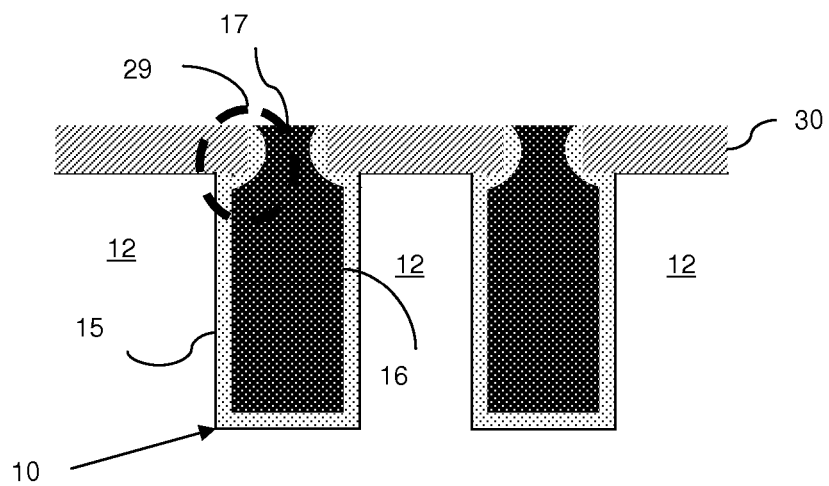
Figure 15:
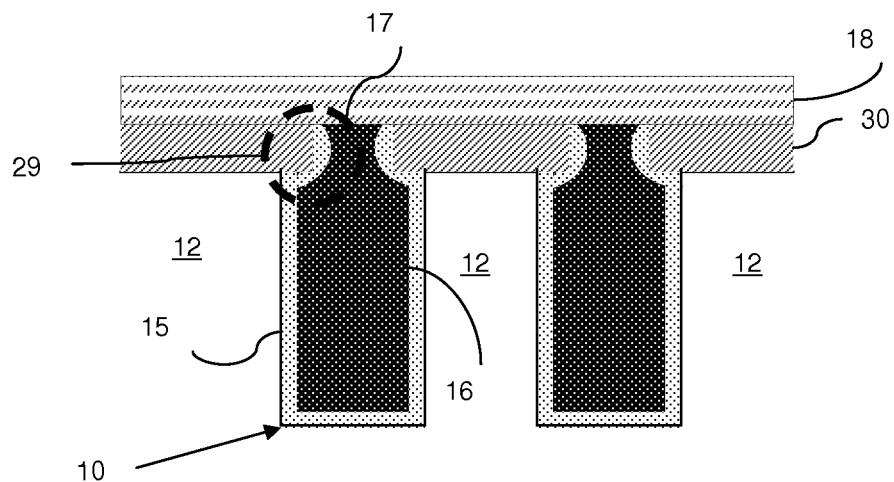
FIG. 15 is a schematic illustration of a cross-section of another completed metal interconnect structure fabricated according to the method of the present invention.

Alternatively, the release layer 20 may be removed (212) immediately after the polishing process (210) (see FIG. 12). Note that the release layer 20 removal process (212) at this stage results in a non-planar surface since the top 17 of conductive interconnect line 10 and the dielectric layer 12 are not level. Therefore, after the release layer 20 is removed (212), as discussed above, a second dielectric layer 30 can be deposited over the dielectric layer 12 and the conductive interconnect line 10 (214, see FIG. 13). Note that if the release layer 20 overlapped the sidewalls 23 of the trench 21 due to an isotropic etching process (see FIG. 5), then top 17 of the conductive interconnect line 10 is narrow compared to the rest of the interconnect line 10 and extends above the dielectric layer 12. Thus, when the release layer 20 is removed and the second dielectric layer 30 is deposited on the dielectric layer 12, the second dielectric layer 30 surrounds the top 17 and reinforces the corners 29 of the conductive interconnect line 10. Corners 29 that are reinforced with the second dielectric layer 30 increase the reliability of the conductive interconnect line 10. This second dielectric layer 30 can be polished (e.g., by CMP) to expose the conductive interconnect line 10 (216; see FIG. 14). This ensures that the capping layer 18 (e.g., nitride layer), when deposited over the dielectric layer 30 (process 220), contacts the conductive interconnect line 10 (220; see FIG. 15).

Figure 16:
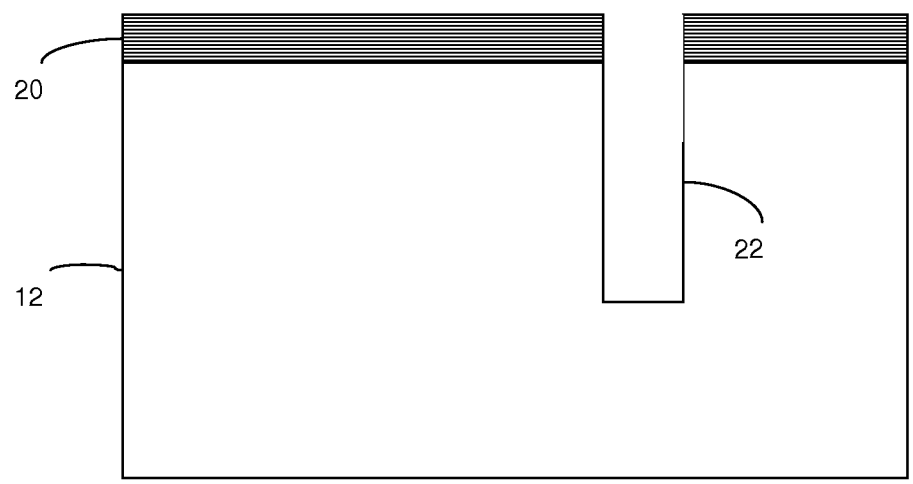
FIGS. 16 through 23 are schematic illustrations of cross-sections of partially completed metal interconnect structures fabricated according to the method of the present invention.
Figure 17:
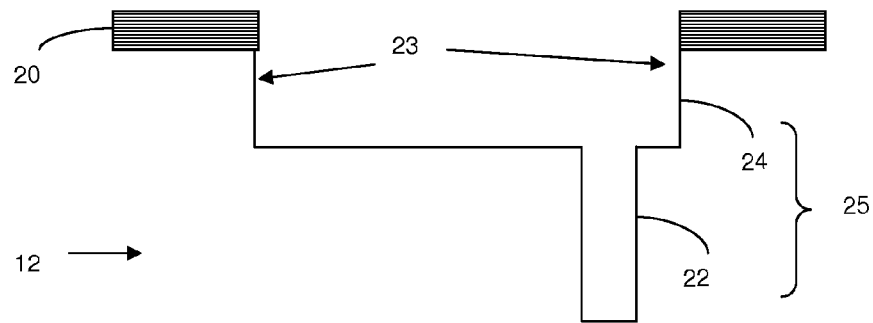
Figure 18:
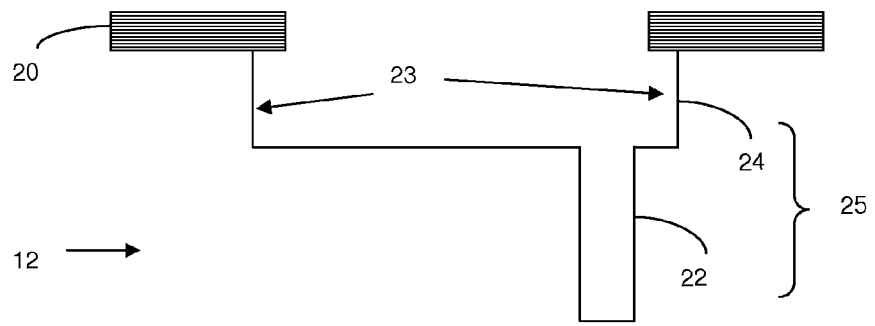
Figure 19:
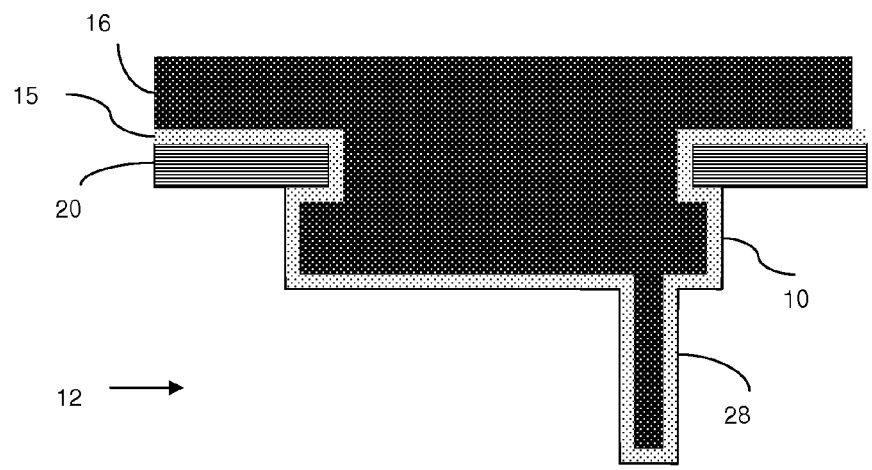

Referring again to the schematic flow diagram of FIG. 2, another embodiment of the method of the present invention provides a dual damascene process for simultaneously forming a conductive interconnect line and via. This embodiment of the method also comprises a sacrificial release layer 20 being formed on dielectric layer 12, e.g., on the silicon oxide layer of a wafer (202; see FIG. 3). The release layer 20 can be formed by depositing one or more of a variety of different materials, such as an organic material, a dielectric material, a metal or a metal oxide, onto the dielectric layer 12. The release layer 20 can be formed by depositing one or more of a variety of different materials, such as an organic material, a dielectric material, a metal or a metal oxide, onto the dielectric layer 12. For example, the release layer 20 can comprise a spin-on organic film, including but not limited to, a photoresist, a polyimide, and an organic spin-on planarizing agent. The release layer 20 can comprise a dielectric material, including but not limited to a silicon oxide, a silicon nitride, a silicon oxynitride, and an aluminum oxide. The release layer 20 can also comprise a metal or a metal nitride such as silicon, tungsten, aluminum, titanium nitride and gallium nitride. In this embodiment, a multi-tier trench 25 is etched through the release layer 20 and into the dielectric layer 12 (204). Specifically, referring to FIGS. 16-17 a first tier 22 and a second tier 24 of a multi-tier trench 25 are etched into the dielectric layer 12. The order of etching the tiers 22 and 24 may vary. The process (204) of etching the second tier 24 can comprise performing an isotropic etching process such that the release layer 20 overlaps the sidewalls 23 of the second tier 24 of the multi-tier trench 25 (see FIG. 18). FIG. 18 is offered for illustrative purposes only. Those skilled in the art will recognize that an isotropic etch will necessarily produce tapered trench 25 sidewalls 23. Allowing the release layer 20 to overlap the sidewalls 23 at this stage in the process provides a means for improving the reliability of the corners of the conductive interconnect lines 10 later in the process (see discussion below). The multi-tier trench 25 is lined with a liner 15 (206) and filled with a conductor 16 (208) (see FIG. 19). Exemplary liner 15 materials are titanium (Ti), titanium nitride (TiN), tantalum (Ta), tantalum nitride (TaN), and tungsten (W). Copper (Cu) is an exemplary conductor 16 material.

Figure 20:
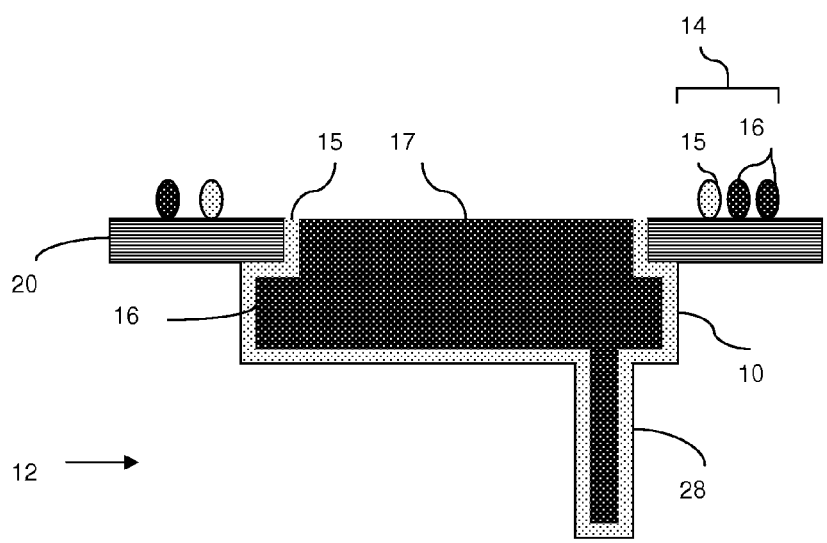

The liner 15 and the conductor 16 are polished off of the release layer 20 (e.g., by CMP), thereby, creating a conductive interconnect line 10 and a conductor filled via 28 (210) (i.e., a dual damascene structure). However, trace amounts 14 of the liner 15 and/or the conductor 16 may remain on the release layer 20 after the polishing process 210 (see FIG. 20). The polishing process 210, e.g., chemical mechanical polishing (CMP) should be performed such that only a minimal amount of the release layer 20 is removed.

Figure 21:
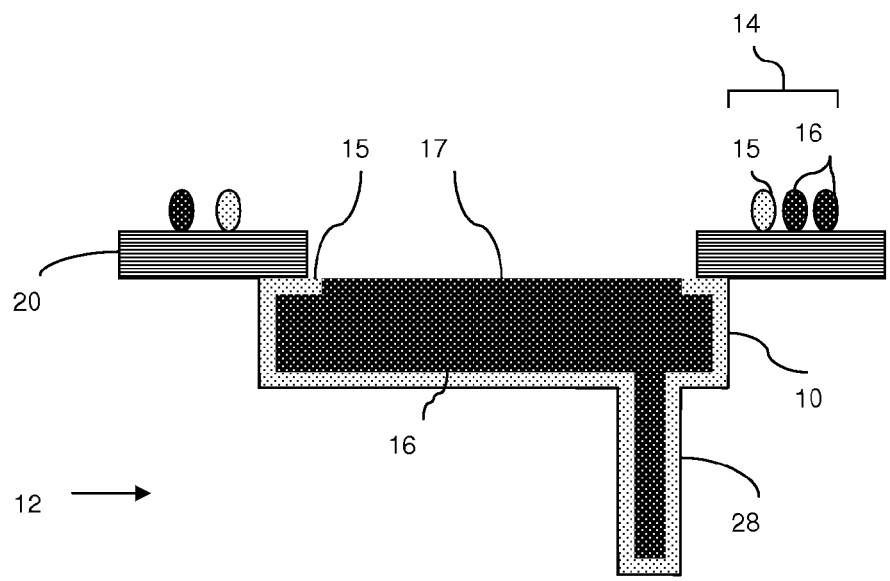
Figure 22:
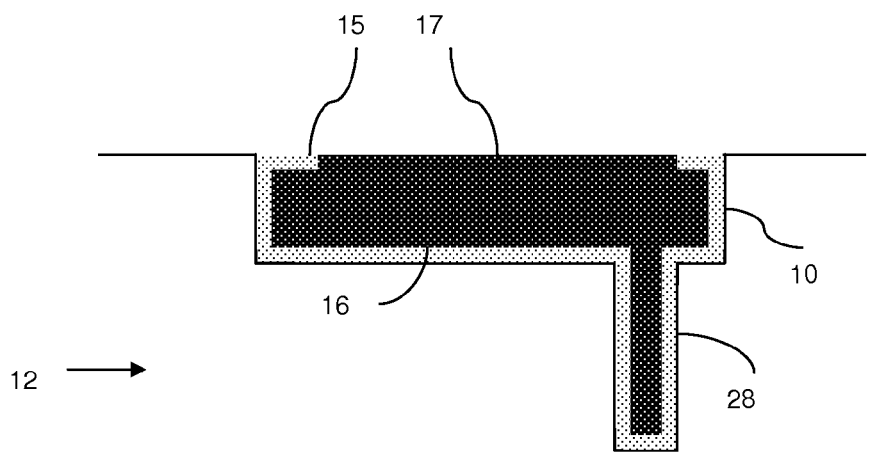
Figure 23:
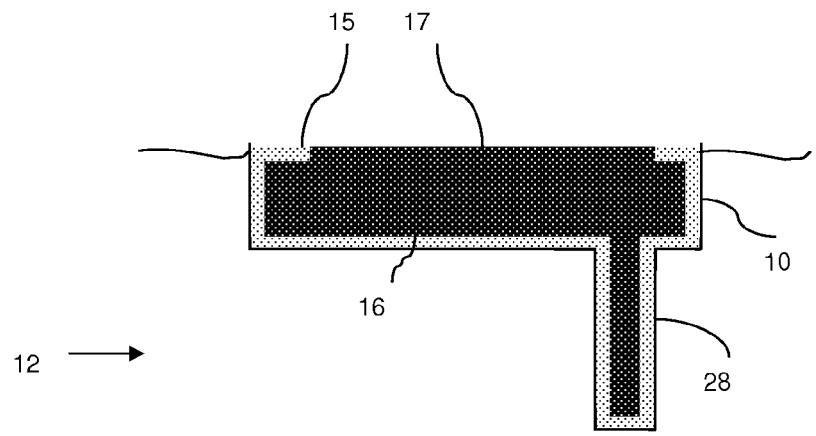
Figure 24:
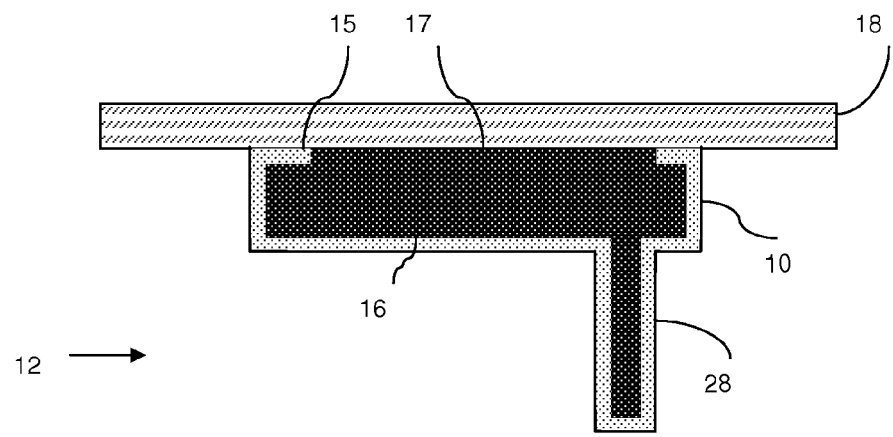
FIG. 24 is a schematic illustration of a cross-section of another completed metal interconnect structure fabricated according to the method of the present invention.

After the polishing process 210, the conductive interconnect line 10 may be recessed (e.g., by selective etching) level with the dielectric layer 12 (211; see FIG. 21). The release layer 20 can then be removed (212; see FIGS. 22-23). As discussed above, the process (212) of removing the release layer 20 is dependent upon the type of material used in depositing the release layer 20. If an organic material is used to form the release layer 20, then an organic solvent may be used to dissolve the release layer 20 (e.g., acetone, isoporpanol, ethanol, trichloroethylene, n-methyl pyrrolidone, etc.). If a dielectric material, a metal or a metal nitride is used to form the release layer 20, then a wet etching process may be used to remove release layer 20. For example, buffered or diluted hydrofluoric acid and water based etchants may be used to remove silicon oxides. Hot phosphoric acid based etchants may be used to remove silicon nitrides and aluminum. Hydroflouric acid and ethylene glycol based etchants may be used to remove silicon oxynitrides. Potassium hydroxide based etchants may be used to remove silicon. Potassium ferricyanide based etchants may be used to remove tungsten. A proprietary etch, such as Transetch®-N, may be used to remove aluminum oxides and gallium nitride. Hydrogen peroxide based etchants may be used to remove titanium nitride. The release layer removal process (212) can be selective for the release layer 20 over the dielectric layer 12 and the conductive interconnect line 10 in order to prevent etch back (e.g., etch back of the dielectric layer, see FIG. 22). However, the removal process (212) does not have to be selective for the release layer 20 over the dielectric layer 12 and the conductive interconnect line 10 (see FIG. 23) as long as after the release layer 20 is removed at process (212), the dielectric layer 12 and the conductive interconnect line 10 are polished (e.g., by CMP) level with each other in order to create a planar surface and to adjust for any etch back of the dielectric layer 12 (218). After removing the release layer 20, a capping layer 18 (e.g., a nitride layer) can be deposited over the dielectric layer 12 and the conductor 16 to complete the structure (220; see FIG. 24).

Figure 25:
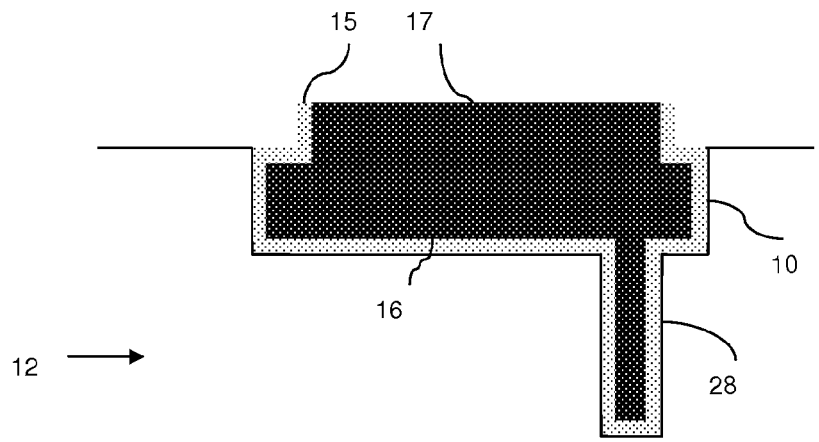
FIGS. 25 through 27 are schematic illustrations of cross-sections of partially completed metal interconnect structures fabricated according to the method of the present invention; and, FIG. 28 is a schematic illustration of a cross-section of another completed metal interconnect structure fabricated according to the method of the present invention.
Figure 26:
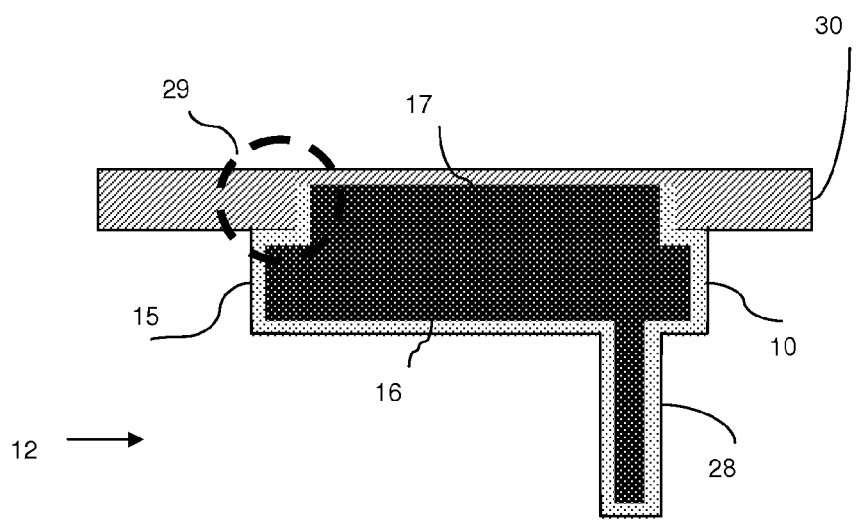
Figure 27:
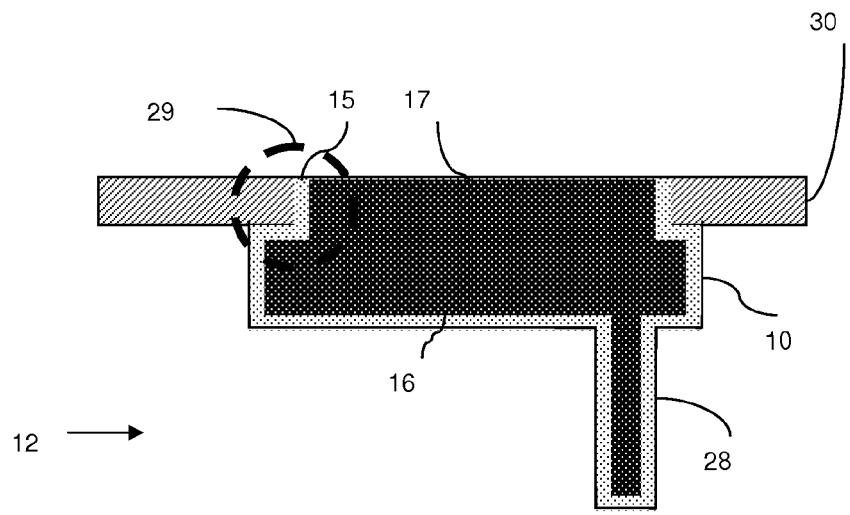
Figure 28:
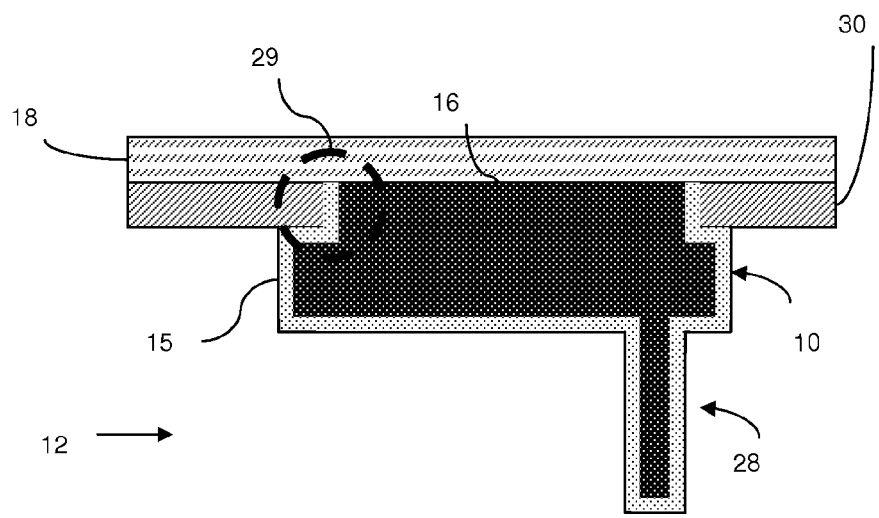

Alternatively, the release layer 20 may be removed (212) immediately after the polishing process (210) (see FIG. 25). Note that the release layer 20 removal process (212) at this stage results in a non-planar surface since the outer surfaces of conductive interconnect line 10 and the dielectric layer 12 are not level. Therefore, after the release layer 20 is removed (212), as discussed above, a second dielectric layer 30 can be deposited over the dielectric layer 12 and the conductive interconnect line 10 (214, see FIG. 26). Note that if the release layer 20 overlapped the sidewalls 23 of the second tier 24 of the multi-layer trench 25 due to an isotropic etching process (see FIG. 18), then top 17 of the conductive interconnect line 10 is narrow compared to the rest of the interconnect line 10 and extends above the dielectric layer 12. Thus, when the release layer 20 is removed and the second dielectric layer 30 is deposited on the dielectric layer 12, the second dielectric layer 30 surrounds the top 17 and reinforces the corners 29 of the conductive interconnect line 10. Corners 29 reinforced with the dielectric material of the second dielectric layer increase the reliability of the conductive interconnect line 10. This second dielectric layer 30 can be polished (e.g., by CMP) to expose the conductive interconnect line 10 (216; see FIG. 27). This ensures that the capping layer 18 (e.g., nitride layer), when deposited over the dielectric layer 30 (process 220), contacts the conductive interconnect line 10 (220; see FIG. 28).

Therefore, improved damascene and dual damascene processes are disclosed. Both processes incorporate the use of a sacrificial release layer to remove trace amounts of residual material, such as liner or conductor material, on the dielectric layer between metal interconnect lines that can cause short circuits. The release layer is deposited onto the dielectric layer of a wafer. The release layer can comprise an organic material, a dielectric material, a metal or a metal nitride. Trenches are etched into the dielectric layer. The trenches are lined with a liner and filled with a conductor. Conductor and liner materials are polished off the release layer; however, trace amounts may remain. The release layer can then be removed (e.g., by an appropriate solvent or wet etching process), to remove any residual conductor or liner material. If the trench is formed such that release layer overlaps the walls of the trench, the conductive interconnect line will necessarily be formed with a top surface that is narrower than the rest of the line and extends above the dielectric layer. Removing the release layer and depositing another dielectric layer around the narrow top of the interconnect line, reinforces the corners at the top of the interconnect line. These reinforced corners will further increase device reliability. While the invention has been described in terms of embodiments, those skilled in the art will recognize that the invention can be practiced with modification within the spirit and scope of the appended claims.

What is claimed is:

1. A method of simultaneously forming different structures in an integrated circuit structure, said method comprising:
   forming a release layer on a dielectric layer, having a top surface;
   etching an opening extending through said release layer and into said dielectric layer such that, within said dielectric layer, said opening has a deep first portion and a shallow second portion above and wider than said deep first portion and further such that edges of said release layer at said opening extend laterally over said shallow second portion, said etching comprising isotropically etching said dielectric layer to form said shallow second portion;
   lining said opening with a liner;
   filling said opening with a conductor, said lining and said filling resulting in a conductive interconnect line in said shallow second portion and a conductive via in said deep first portion, said conductive interconnect line having lined corners adjacent said top surface of said dielectric layer;
   polishing said liner and said conductor off of said release layer; and
   removing said release layer using a process other than chemical mechanical processing such that any trace amounts of said liner and said conductor that remain on said release layer after said polishing are completely removed as said release layer is removed.

2. The method of claim 1, further comprising:
   after said polishing of said liner and said conductor off of said release layer and before said removing of said release layer, recessing said conductive interconnect line level with said top surface of said dielectric layer; and
   after said removing of said release layer, depositing a capping layer over said dielectric layer and said conductor.

3. The method of claim 1,
said removing of said release layer resulting in a narrow top portion of said conductive interconnect line that extends above said dielectric layer, and
said method further comprising:
depositing a second dielectric layer over said dielectric layer and said conductive interconnect line such that said second dielectric layer laterally surrounds said narrow top portion of said conductive interconnect line;
polishing said second dielectric layer to expose said narrow top portion of said conductive interconnect line; and
depositing a capping layer over said second dielectric layer and said narrow top portion of said conductive interconnect line.

4. The method of claim 1,
said forming of said release layer comprising depositing an organic material, and
said removing of said release layer comprising dissolving said release layer in an organic solvent.

5. The method of claim 1,
said forming of said release layer comprising depositing a dielectric material, and
said removing of said release layer comprising performing a wet etching process.

6. The method of claim 1,
said forming of said release layer comprising depositing one of a metal and a metal nitride, and
said removing of said release layer comprising performing a wet etching process.

7. The method of claim 1, said removing of said release layer comprising selectively removing said release layer to prevent etch back of at least one of said dielectric layer and said conductive interconnect line.

8. The method of claim 1, further comprising, after said removing of said release layer, polishing said dielectric layer and said conductive interconnect line level to adjust for any etch back of said dielectric layer and said conductive interconnect line.

9. A method of simultaneously forming different structures in an integrated circuit structure, said method comprising:
forming a release layer on a dielectric layer, having a top surface, by depositing an organic material;
etching an opening extending through said release layer and into said dielectric layer such that, within said dielectric layer, said opening has a deep first portion and a shallow second portion above and wider than said deep first portion and further such that edges of said release layer at said opening extend laterally over said shallow second portion, said etching comprising isotropically etching said dielectric layer to form said shallow second portion;
lining said opening with a liner;
filling said opening with a conductor, said lining and said filling resulting in a conductive interconnect line in said shallow second portion and a conductive via in said deep first portion, said conductive interconnect line having lined corners adjacent said top surface of said dielectric layer;
polishing said liner and said conductor off of said release layer; and
removing said release layer by dissolving said release layer in an organic solvent such that any trace amounts of said liner and said conductor that remain on said release layer after said polishing are completely removed as said release layer is removed.

10. The method of claim 9, further comprising:
after said polishing of said liner and said conductor off of said release layer and before said removing of said release layer, recessing said conductive interconnect line level with said top surface of said dielectric layer; and
after said removing of said release layer, depositing a capping layer over said dielectric layer and said conductor.

11. The method of claim 9,
said removing of said release layer resulting in a narrow top portion of said conductive interconnect line that extends above said dielectric layer, and
said method further comprising:
depositing a second dielectric layer over said dielectric layer and said conductive interconnect line such that said second dielectric layer laterally surrounds said narrow top portion of said conductive interconnect line forming reinforced corners;
polishing said second dielectric layer to expose said narrow top portion of said conductive interconnect line; and
depositing a capping layer over said second dielectric layer and said narrow top portion of said conductive interconnect line.

12. The method of claim 9, said removing of said release layer comprising selectively removing said release layer to prevent etch back of at least one of said dielectric layer and said conductive interconnect line.

13. The method of claim 9, further comprising, after said removing of said release layer, polishing said dielectric layer and said conductive interconnect line level to adjust for any etch back of said dielectric layer and said conductive interconnect line.

14. A method of simultaneously forming different structures in an integrated circuit structure, said method comprising:
forming a release layer on a dielectric layer, having a top surface, by depositing a dielectric material;
etching an opening extending through said release layer and into said dielectric layer such that, within said dielectric layer, said opening has a deep first portion and a shallow second portion above and wider than said deep first portion and further such that edges of said release layer at said opening extend laterally over said shallow second portion, said etching comprising isotropically etching said dielectric layer to form said shallow second portion;
lining said opening with a liner;
filling said opening with a conductor, said lining and said filling resulting in a conductive interconnect line in said shallow second portion and a conductive via in said deep first portion, said conductive interconnect line having lined corners adjacent said top surface of said dielectric layer;
polishing said liner and said conductor off of said release layer; and
removing said release layer by performing a wet etch process such that any trace amounts of said liner and said conductor that remain on said release layer after said polishing are completely removed as said release layer is removed.

15. The method of claim 14, further comprising:
after said polishing of said liner and said conductor off of said release layer and before said removing of said release layer, recessing said conductive interconnect line level with said top surface of said dielectric layer; and after said removing of said release layer, depositing a capping layer over said dielectric layer and said conductor.

16. The method of claim 14,
said removing of said release layer resulting in a narrow top portion of said conductive interconnect line that extends above said dielectric layer and said method further comprising:
depositing a second dielectric layer over said dielectric layer and said conductive interconnect line such that said second dielectric layer laterally surrounds said narrow top portion of said conductive interconnect line forming reinforced corners;
polishing said second dielectric layer to expose said narrow top portion of said conductive interconnect line; and
depositing a capping layer over said second dielectric layer and said narrow top portion of said conductive interconnect line.

17. The method of claim 14, said removing of said release layer comprising selectively removing said release layer to prevent etch back of at least one of said dielectric layer and said conductive interconnect line.

18. The method of claim 14, further comprising, after said removing of said release layer, polishing said dielectric layer and said conductive interconnect line level to adjust for any etch back of said dielectric layer and said conductive interconnect line.

19. A method of simultaneously forming different structures in an integrated circuit structure, said method comprising:
forming a release layer on a dielectric layer, having a top surface, by depositing one of a metal and a metal nitride material;
etching an opening extending through said release layer and into said dielectric layer such that, within said dielectric layer, said opening has a deep first portion and a shallow second portion above and wider than said deep first portion and further such that edges of said release layer at said opening extend laterally over said shallow second portion, said etching comprising isotropically etching said dielectric layer to form said shallow second portion;
lining said opening with a liner;
filling said opening with a conductor, said lining and said filling resulting in a conductive interconnect line in said shallow second portion and a conductive via in said deep first portion, said conductive interconnect line having lined corners adjacent said top surface of said dielectric layer;
polishing said liner and said conductor off of said release layer; and
removing said release layer by performing a wet etch process that selectively removes said release layer such that etch back of at least one of said dielectric layer and said conductive interconnect line is prevented and such that any trace amounts of said liner and said conductor that remain on said release layer after said polishing are completely removed.

20. The method of claim 19, further comprising:
after said polishing of said liner and said conductor off of said release layer and before said removing of said release layer, recessing said conductive interconnect line level with said top surface of said dielectric layer; and
after said removing of said release layer, depositing a capping layer over said dielectric layer and said conductor.

21. The method of claim 19,
said removing of said release layer resulting in a narrow top portion of said conductive interconnect line that extends above said dielectric layer and said method further comprising:
depositing a second dielectric layer over said dielectric layer and said conductive interconnect line such that said second dielectric layer laterally surrounds said narrow top portion of said conductive interconnect line forming reinforced corners;
polishing said second dielectric layer to expose said narrow top portion of said conductive interconnect line; and
depositing a capping layer over said second dielectric layer and said narrow top portion of said conductive interconnect line.

* * * * *